United States Patent [19]
Yi et al.

[11] Patent Number: 6,166,478
[45] Date of Patent: Dec. 26, 2000

[54] METHOD FOR ASSEMBLY OF MICROELECTROMECHANICAL SYSTEMS USING MAGNETIC ACTUATION

[75] Inventors: Yong Wuk Yi, Montgomery; Chang Liu, Champaign, both of Ill.

[73] Assignee: The Board of Trustees of the University of Illinois, Urbana, Ill.

[21] Appl. No.: 09/325,967

[22] Filed: Jun. 4, 1999

[51] Int. Cl.$^7$ .................................................. H01L 41/04
[52] U.S. Cl. ............................................................. 310/328
[58] Field of Search ..................................... 310/326, 328

[56] References Cited

U.S. PATENT DOCUMENTS 5,629,918   5/1997   Ho et al. .................................. 369/112
5,642,015   6/1997   Whitehead et al. ..................... 310/309

OTHER PUBLICATIONS

J.W. Judy, R.S.Muller, H. H. Zappe, "Magnetic Microactuation of Polysilicon Flexure Structures", *Journal of Microelectromechanical Systems*, vol. 4, No. 4 Dec. 1995, pp. 162–169.

C. Liu, T. Tsao, Y.C. Tai, T.S. Leu, S.M. Ho, W.L. Tang, D. Miu, "Out–of–Plane Permalloy Magnetic Actuators for Delta–Wing Control" *IEEE*, 1995, pp. 7–12.

J.W. Judy, R.S. Muller, "Magnetically Actuated, Addressable Microstructures",*IEEE*, 1997, pp. 249–255.

K.S.J. Pister, M.W. Judy, S.R. Burgett, R.S. Fearing, "Microfabricated Hinges", *Sensors and Actuators,*vol. 33, 1991, pp. 249–256.

J.R. Reid, V.M. Bright, J.H. Comtois, "Automated Assembly of Flip–Up Micromirrors"; *Sensors and Actuators*, vol. A66, No. 1–3, pp. 292–8, 1998.

Y.W. Yi, C. Liu, "Magnetic Actuation of Hinged Microstructures", *IEEE*Journal of Microelectromechanical Systems, vol. 8, No. 1, Mar. 1999, pp. 10–17.

*Primary Examiner*—Nestor Ramirez
*Assistant Examiner*—Peter Medley
*Attorney, Agent, or Firm*—Grer, Burns & Crain, Ltd.

[57] ABSTRACT

A microelectromechanical system (MEMS) includes at least two hinged flaps, each having a different amount of Permalloy or other magnetic material. The flaps are hinged at an angle to each other, and can be rotated off plane when placed in a magnetic field of sufficient strength. When placed in an increasing magnetic field, the flaps are raised asynchronously, at different times, due to the different amounts of Permalloy used in the flaps. As they are raised, the flaps interact with each other and become interlocked, even after the magnetic field is removed. In this manner, the devices can be assembled using a single magnetic field, without having actuators on the chip itself In another embodiment, at least one flap is provided with a spring beam which raises the magnetic field strength needed to raise the flap as compared to another flap. This also causes the flaps to operate asynchronously in an increasing magnetic field.

9 Claims, 6 Drawing Sheets

METHOD FOR ASSEMBLY OF MICROELECTROMECHANICAL SYSTEMS USING MAGNETIC ACTUATION

FIELD OF THE INVENTION

This invention relates to microelectromechanical systems (MEMS) using magnetic actuation, and more particularly, processes and designs for manufacturing and assembling three-dimensional MEMS having multiple flaps which operate asynchronously because they are responsive to magnetic fields of different strengths, and interlock when assembled, so that constant actuation is not needed.

BACKGROUND OF THE INVENTION

MEMS have many applications including micro optical components, such as Fresnel lenses, optical gratings and corner cube reflectors. The structures are usually fabricated on a silicon substrate. Using sacrificial layers and other techniques, a MEMS includes at least one flap which rests on the substrate. The flap is hinged on one side, and when actuated, rotates off plane around the hinge and off of the substrate.

The flap can be raised from the substrate using magnetic actuation. However, off plane displacement of the structure requires a constant source of energy, which is usually provided by a dedicated on-chip micro actuator that is mechanically, electrically or magnetically linked to the flap. The ability to deploy large arrays of devices is compromised because each actuator must be individually biased. Moreover, most actuators occupy a relatively large chip area (on the order of 100 $\mu m^2$) in addition to the flap itself, which increases die sizes and limits the ultimate area density of integrated optical MEMS.

Thus, there is a need for MEMS processes and designs which do not require a constant source of energy to be maintained in an off-plane condition. There is also a need for MEMS processes and designs which do not require individual biasing, and do not require a relatively large chip area, if desired.

Accordingly, one object of the present invention is to provide new and improved MEMS using magnetic actuation.

Another object is to provide new and improved MEMS which do not require individual biasing apparatus.

Still another object is to provide new and improved MEMS which do not require an actuator on an integrated circuit on which the MEMS is assembled.

Yet another object is to provide a new and improved MEMS having multiple flaps which are asynchronously actuated by a single magnetic source.

A still further object is to provide a new and improved MEMS having multiple flaps which interlock when assembled to form a three dimensional structure, and do not require a constant energy source to remain assembled.

SUMMARY OF THE INVENTION

In keeping with one aspect of the invention, a MEMS assembly includes at least two hinged flaps, each having a different amount of Permalloy or other magnetic material. The flaps are hinged at an angle to each other, and can be rotated off plane when placed in a magnetic field of sufficient strength. When placed in an increasing magnetic field, the flaps are raised asynchronously, at different rates, due to the different amounts of Permalloy magnetic material used in the flaps. As they are raised, the flaps interact with each other and become interlocked. They can be designed so that they remain interlocked after the magnetic field is removed. In this manner, the devices can be assembled using a single magnetic field, without having actuators on the chip itself.

In another embodiment, at least one flap is provided with a spring beam, also called an offset slab, which raises the magnetic field strength needed to raise the flap as compared to another flap. This also causes the flaps to operate asynchronously in an increasing magnetic field. In addition, the spring beam provides variable resistance to the flap when it is positioned at different angles.

BRIEF DESCRIPTION OF THE DRAWINGS

These and other features and advantages of the invention will be apparent to those skilled in the art with reference to the detailed description and the drawings, of which.

DETAILED DESCRIPTION

Figure 1A:
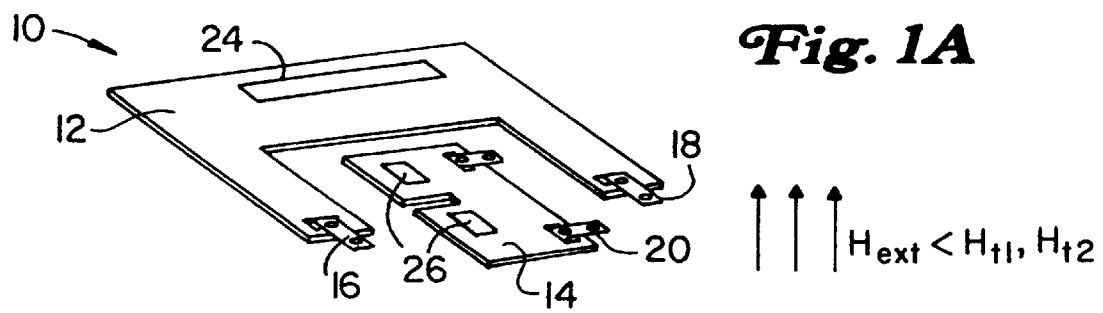
FIGS. 1A, 1B and 1C are perspective schematic views of a MEMS made in accordance with the principles of this invention.

Referring to FIG. 1A, a microelectromechanical system (MEMS) 10 includes a primary flap 12 and a secondary flap 14. The primary flap 12 is anchored to a substrate (not shown) by hinges 16, 18, and the secondary flap 14 is secured to the substrate by hinges 20, 22. The primary flap 12 includes a predetermined amount of Permalloy or other suitable material 24, and the secondary flap 14 also has a predetermined, and usually smaller amount of Permalloy magnetic material or other suitable material 26. The Permalloy magnetic material makes the flaps 12, 14 responsive to a sufficiently strong external magnetic field $H_{ext}$. However, because different amounts of Permalloy magnetic material are used on the flaps, the primary flap 12 is responsive to a threshold field $H_{t1}$, and the secondary flap 14 is responsive to a stronger threshold field $H_{t2}$.

Figure 1B:
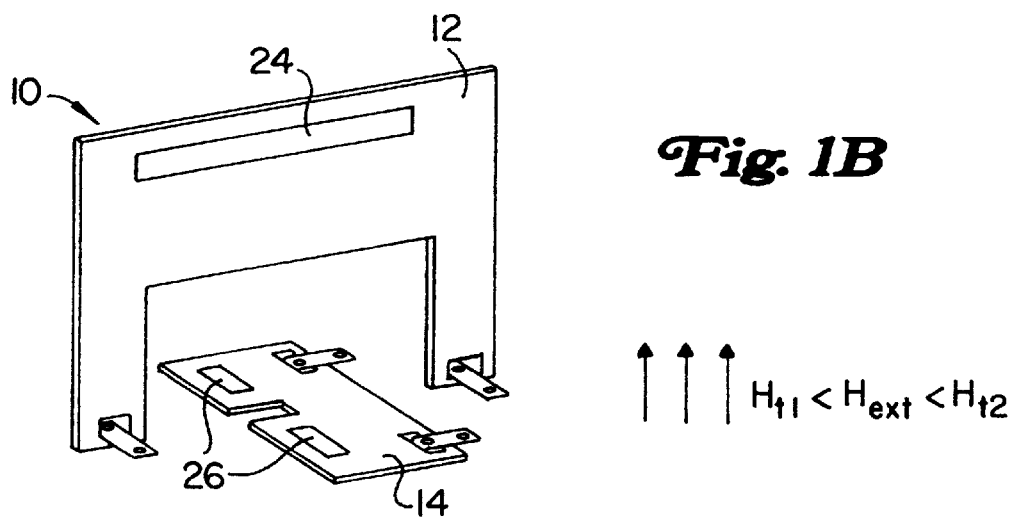

When the magnetic field $H_{ext}$ is initially applied to the MEMS 10 and increases to $H_{t1}$, the primary flap 12 is raised, as seen in FIG. 1B. However, the secondary flap 14 does not respond when the magnetic field only reaches $H_{t1}$1, and is not raised.

Figure 1C:
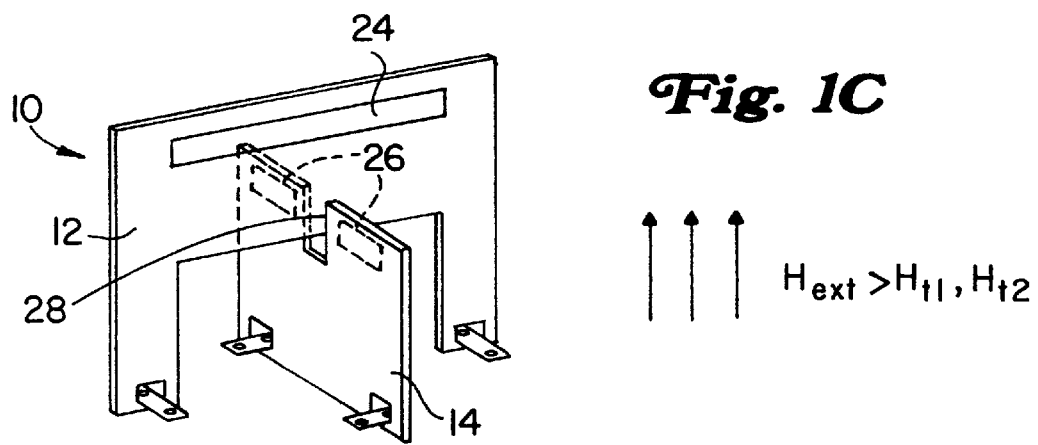

When the increasing magnetic field $H_{ext}$ reaches a strength of $H_{t2}$, the secondary flap 14 is raised, as seen in FIG. 1(C). An indentation 28 can be provided in the secondary flap 14, so that the flaps 12, 14 interact with each other and interlock. Thus, by using different amounts of Permalloy magnetic material on the flaps, the flaps can be designed to operate asynchronously with respect to each other when subjected to an increasing magnetic field.

The flaps in the MEMS 10 can assume only two steady positions, θ=0, as in FIG. 1A, and θ=90°, as in FIGS. 1B and 1C. When no magnetic field is applied, the Permalloy magnetic material is not magnetized and the flaps lie in the substrate plane with θ=0°. As $H_{ext}$ is increased, the flap displacement remains at 0° until a threshold magnetic field strength $H_t$ is reached. As the magnetic field reaches the threshold value, the magnetization of the Permalloy piece generates sufficient torque to cause the respective flaps to rotate. Because there is no mechanical resistive force to counteract the torque created by the magnetization of the Permalloy material, the flaps make a direct transition to θ=90°, aligning with the magnetic field lines.

The threshold magnetic field strength $H_t$ of a hinged flap is related to the volume of the attached Permalloy material. Therefore, the displacement angle of different micro structures, under the same magnetic bias, can be effectively controlled by choosing the volume of the attached Permalloy material.

Figure 2:
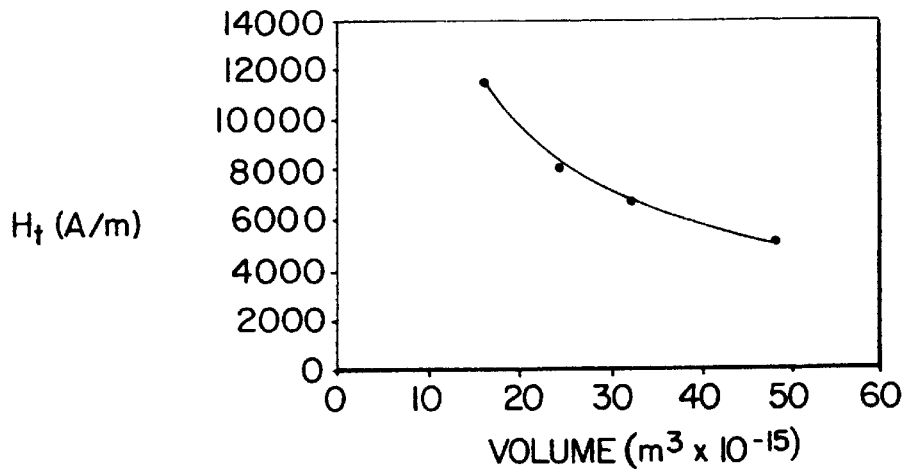
FIG. 2 is a graph of experimental data showing the relationship between Permalloy volume and threshold magnetic field in the MEMS of FIG. 1.

In experiments, $H_t$ measurements were performed with identical flap dimensions, but with different volumes of Permalloy magnetic material. Each data set contained three identical sample structures (having the same volume of Permalloy material). The empirical expression of the relationship between the average value of $H_t$ and the dimensions of the magnetic piece is summarized in the equation $$H_t = 7 \times 10^{-7} \, (length \times width \times thickness)^{-0.7392}$$

with the constants being extracted from experimental data shown in FIG. 2.

Hinged flaps and assemblies can be fabricated based on established surface micromachining processes such as the Multi-User MEMS Process (MUMPS). The major steps in the process are shown in FIGS. 3A–3D.

Figure 3A:
FIGS. 3A, 3B, 3C and 3D are diagrams showing the steps in production of flaps for the device shown in FIGS. 1A–1C.
Figure 3B:
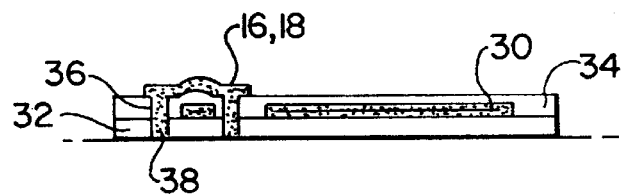
Figure 3C:
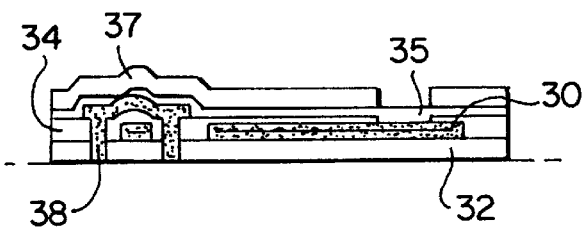

To form a flap 12, a layer of polysilicon 30 is deposited and patterned on top of a sacrificial oxide 32 (FIG. 3(A)). A second oxide layer 34 is grown and vias 36 are etched so that hinges 16, 18 can anchor to the substrate (FIG. 3(B)). The final step in structure fabrication is to deposit and pattern a second polysilicon layer 38, forming the hinge (FIG. 3(B)).

The magnetic material (Permalloy $Ni_{80}Fe_{20}$) 24 is then attached to the flap. The first step is to expose the first polysilicon layer by selectively opening the second oxide 34 (FIG. 3(C)). Layers of Cr and Cu are then deposited as a seed layer 35 for the electroplating process. Because Cu does not adhere well to the substrate, an initial 200 A-thick Cr layer is sputtered to act as an adhesion promoter between polysilicon and Cu. A layer of Cu (4000A) is evaporated to provide adequate electrical continuity for the electroplating process. A 6.2 µm thick layer of photoresist (PR)37 is patterned on the seed layer and the magnetic material is mold electroplated to the desired thickness (not shown in FIG. 3(C)).

Figure 3D:
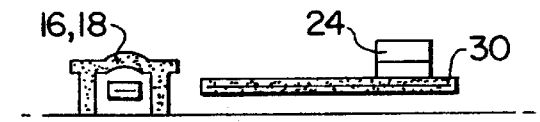

After the magnetic material has been electroplated, the photoresist (PR)37 and the exposed seed layer materials are removed (FIG. 3(D)). The structures are then released in hydrofluoric acid HF (49% wt.) and rinsed in deionized water. The patterned Permalloy material 24 is unaffected throughout this process as it is resistive to HF, and Cu and Cr etchants. The final step is to place the chip in isopropyl alcohol and allow the solution to dry in air. As the isopropyl alcohol evaporates, surface tensions of the liquid can force the flaps to come into contact with the substrate and cause stiction. To remedy this, a magnetic field ($8.1 \times 10^4$ A/m) is applied to the chip so that the flaps are rotated by 90° during the liquid evaporation; the magnetic field is maintained until the isopropyl alcohol is completely evaporated.

The threshold magnetic field of a flap can also be increased by providing a cantilever spring beam 40, as in FIGS. 4, 5A, 5B and 5C.

Figure 4:
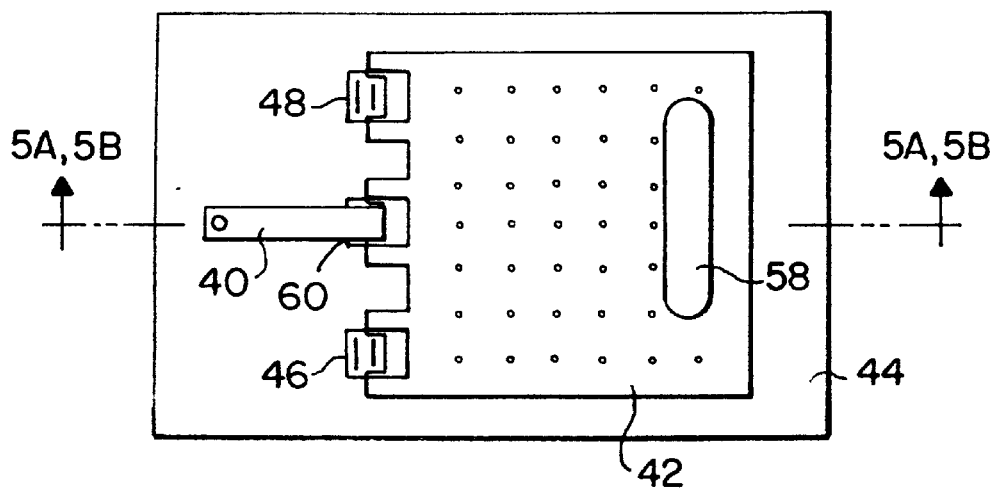
FIG. 4 is a plan view of an alternate embodiment of the invention.

Referring now to FIG. 4, a flap 42 is secured to a substrate 44 by hinges 46, 48. The hinges 46, 48 pass through openings 50, 52 in the flap 42, with portions 54, 56 of the flap 42 passing beneath the hinges 46, 48. Magnetic material 58, such as Permalloy, is provided on the flap 42.

Figure 5A:
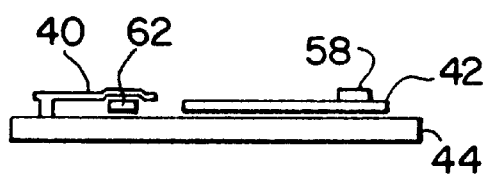
FIGS. 5A, 5B and 5C are diagrams showing the operation of the device shown in FIG. 4.
Figure 5B:
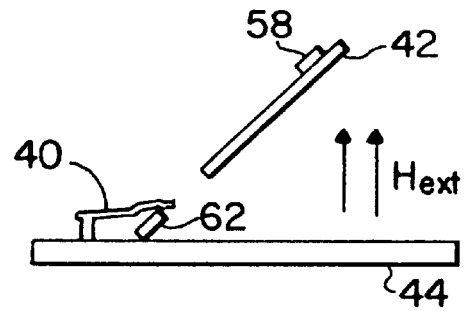

Flap 42 also includes an opening 60 formed in part by an offset slab 62. The cantilever spring beam 40 extends over the offset slab 62, and partially over the opening 60, as seen in FIGS. 5A and 5B.

In the absence of an external magnetic field, the flap 42 is in a relaxed condition, on or near the substrate 44. The offset slab 62 is usually not under tension from the spring beam 40. However, when a sufficient magnetic field $H_{ext}$ is applied (FIG. 5B), magnetization of the Permalloy material 58 causes the flap 42 to rotate upwardly. At some point, the offset slab 62 engages the spring beam 40, creating resistance to further rotation of the flap 42.

Figure 5C:
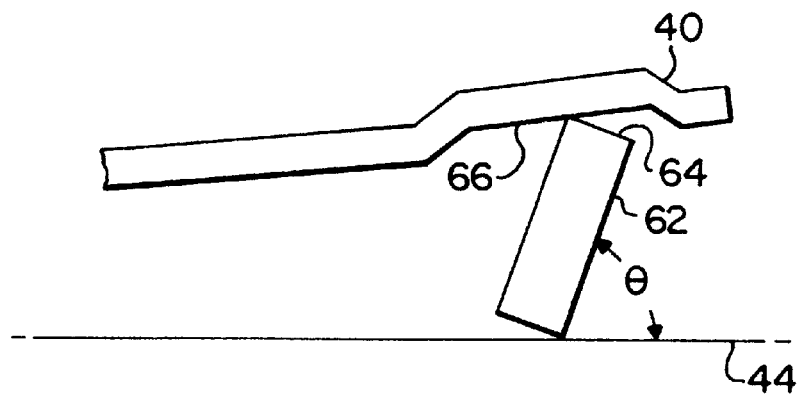

FIG. 5C shows the spring beam 40 in greater detail. In this configuration, the offset slab 62 is at an angle θ to the substrate plane 44. When θ equals 90° a flat surface 64 of the offset slab 62 engages a flat surface 66 of the spring beam 40, creating a stable arrangement.

This embodiment can be used with other flaps to make a three-dimensional MEMS, similar to the device shown in FIGS. 1A–C. However, the same amount of magnetic material (Permalloy) can be used for both flaps, because the spring beam 40 changes the threshold magnetic field to allow asynchronous operation of the flaps in an increasing external magnetic field. Of course, spring beams could be used for both flaps, if desired, by varying the spring force they create. Also, features of these embodiments could be combined in any suitable manner to create an operational device.

Unlike the structures described in the first embodiment of the invention, which have two stable positions (θ=0° and θ=90°), flaps having a beam 40 can achieve steadily varying displacements (within a certain range) due to the counteractive spring loading mechanism provided by the beam 40.

The flap is initially in the plane of the substrate until an adequate magnetic torque is present to cause the flap to rotate (FIG. 5(A)). The offset slab does not contact the cantilever until the flap has been deflected by nearly 32° (FIG. 5(B)). After the offset slab and the cantilever beam have made contact, increases in $H_{ext}$ result in steady increasing displacement of the beam. This is attributed to partial magnetization of the Permalloy material at lower values of $H_{ext}$. In this region, the magnetization of the Permalloy material will vary as a function of the applied magnetic field until it reaches the saturation magnetization ($M_s$).

As the Permalloy material reaches the saturation magnetization, the rate of change in displacement with respect to $H_{ext}$ reaches a maximum. Beam displacement approaches an asymptotic value due to the angular dependents of the magnetic torque. The vertical deflection of the beam 40 gradually increases until it reaches a maximum value when the offset slab is at θ=71°, as defined by the diagonal length of the offset slab cross-section (FIG. 5(c)).

Finally, the angular displacement approaches 90° very rapidly. The vertical displacement of the cantilever beam will actually decrease as the flap displacement is increased from 71° to 90°. The exact angle at which the transition to θ=90° occurs is influenced by frictional forces and the edge profile of the offset slab. From experimental data, it appears that this occurs most often near θ=78°. The flap is able to make a direct transition to 90° because the resistive forces produced by the cantilever beam favor increases of θ.

Using experimental results, a design rule has emerged that allows realization of asynchronous actuation. $H_{70}$ is defined as the magnitude of the external magnetic field necessary to achieve a 70° displacement of a flap. The magnitude of $H_{70}$ is a function of both the Permalloy volume and the cantilever spring beam dimensions, and $H_{70}$ decreases with increasing Permalloy piece volume in decreasing cantilever spring beam width. The relationship between $H_{70}$ and the Permalloy volume is given by $H_{70} = C \cdot \text{Ln}(l_m w_m t_m) + K$ where C and K are constants obtained from the experimental data.

Figure 10:
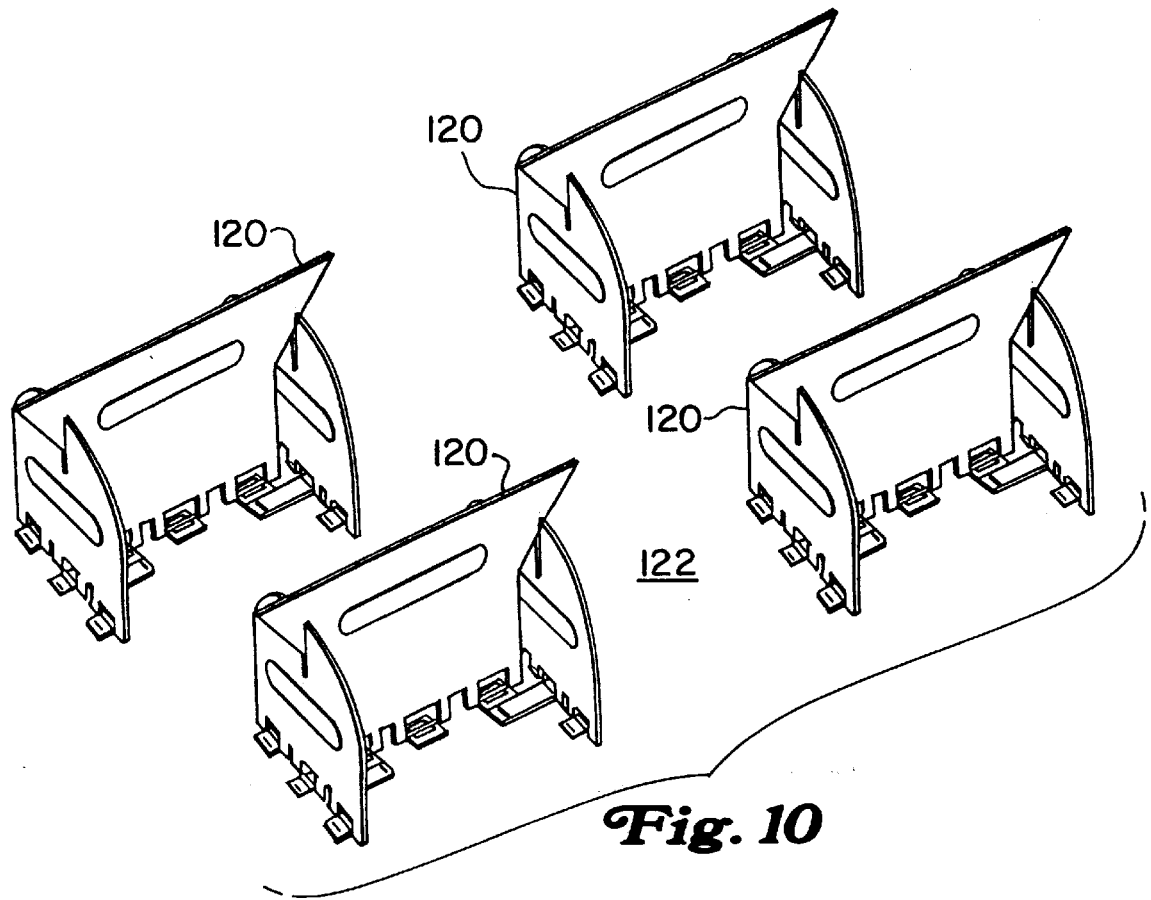
FIG. 10 is a perspective view of a plurality of MEMS devices made in accordance with the present invention.

Single MEMS devices can be made, if desired, but it is also possible to make many MEMS devices on a single chip, as seen in FIG. 10. In FIG. 10, a plurality of MEMS 120 are located on a substrate 122, in close proximity to each other. Magnetic actuators on the substrate 122 are not required, because all of the MEMS 120 can be actuated by an external magnetic field. Also, an external magnetic field is not required after the three-dimensional MEMS devices are assembled.

Figure 6A:
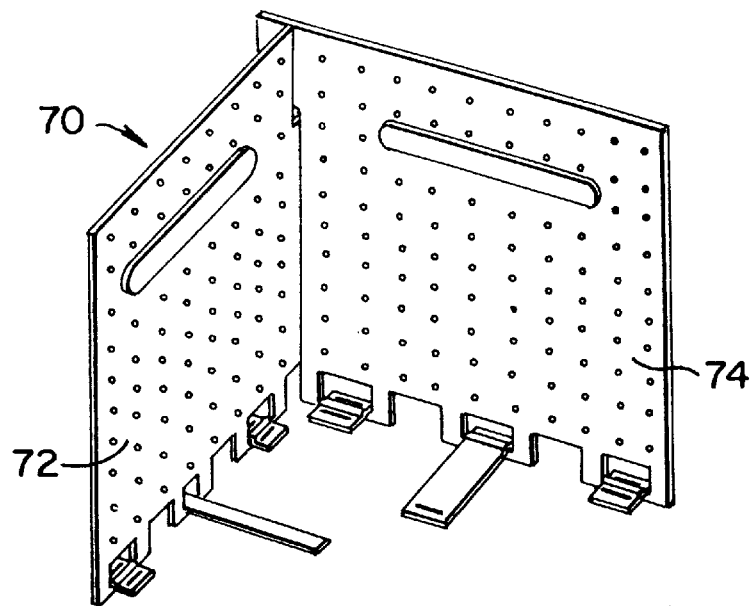
FIGS. 6(A) and 6(B) are perspective views of a three-dimensional MEMS made in accordance with the principles of this invention.
Figure 6B:
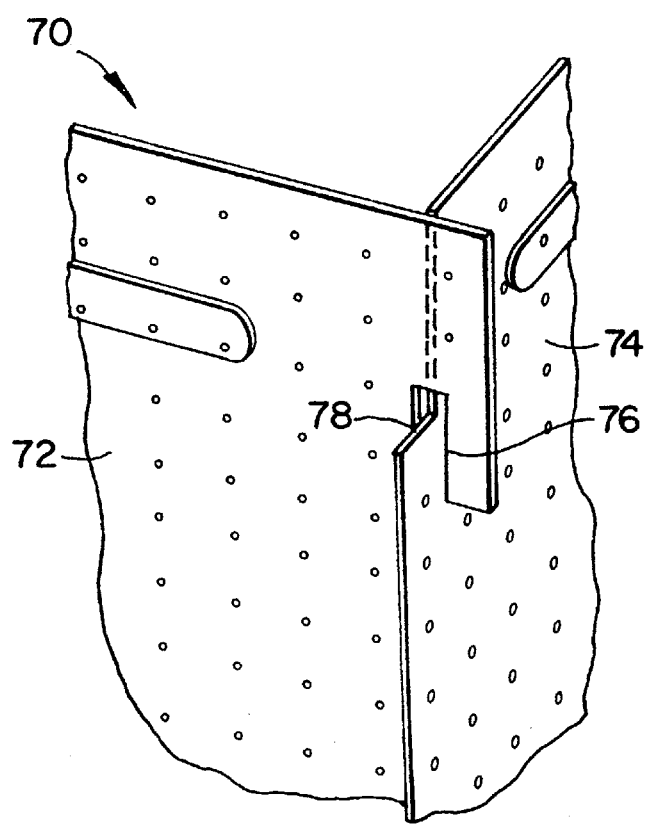

The invention has many uses in various configurations. For example, FIGS. 6(a) and 6(b) show a device 70 having flaps 72, 74 which form a corner cube reflector. An indentation 76 is provided in the flap 72, to interlock with a cut-out portion 78 in the face 74.

Figure 7:
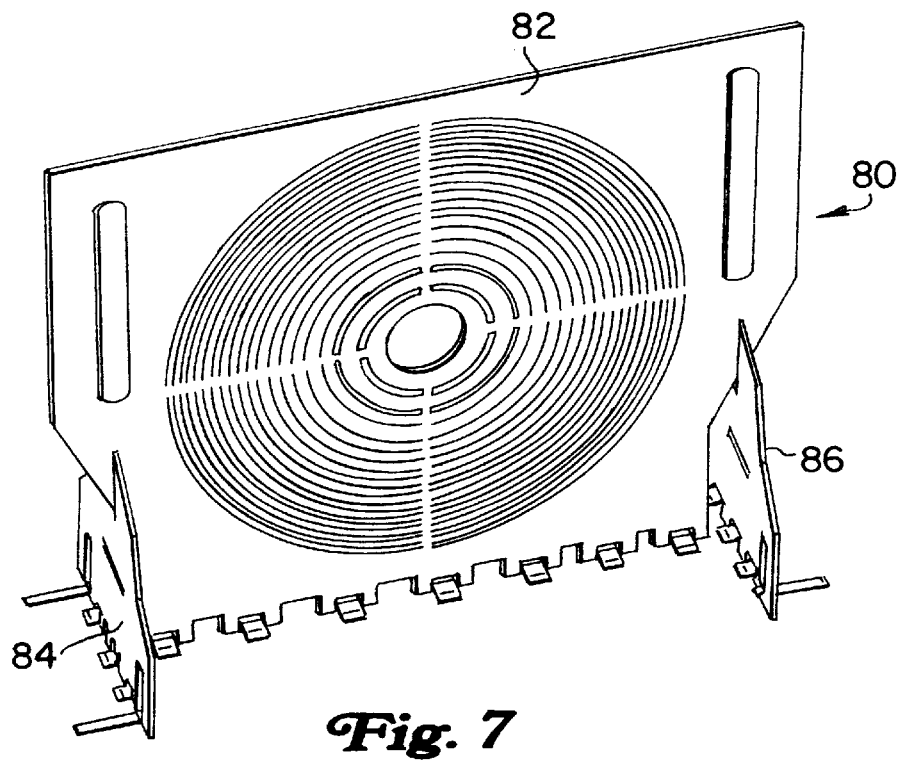
FIG. 7 is another MEMS made in accordance with the principles of this invention.

FIG. 7 shows a MEMS 80 having a primary flap 82, flanked and supported by secondary flaps 84, 86. The device 80 is a Fresnel lens. The secondary flaps 84, 86 provide dual support to maintain the stability of the device.

Figure 8:
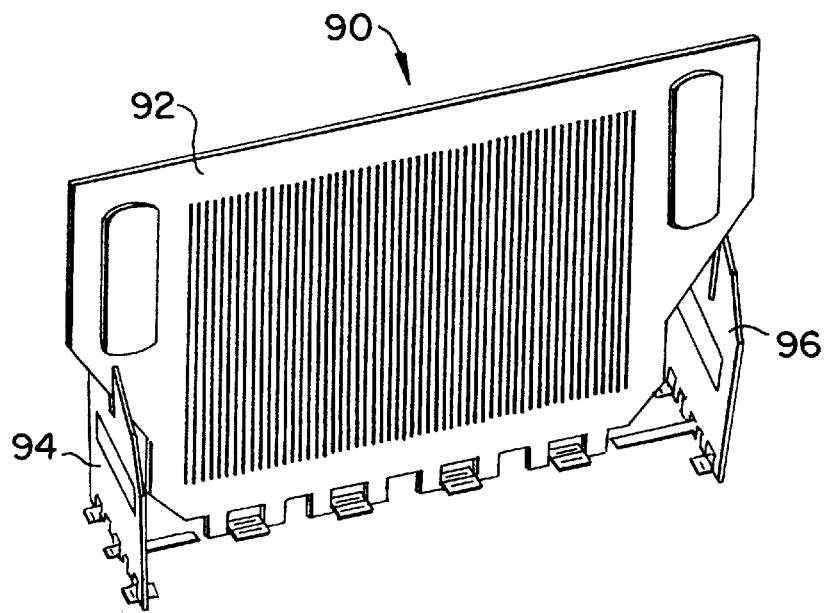
FIG. 8 is still another MEMS made in accordance with the present invention.

Similarly, FIG. 8 shows another MEMS 90 having a primary flap 92 and secondary flaps 94, 96. The device 90 is an optical lens.

Figure 9:
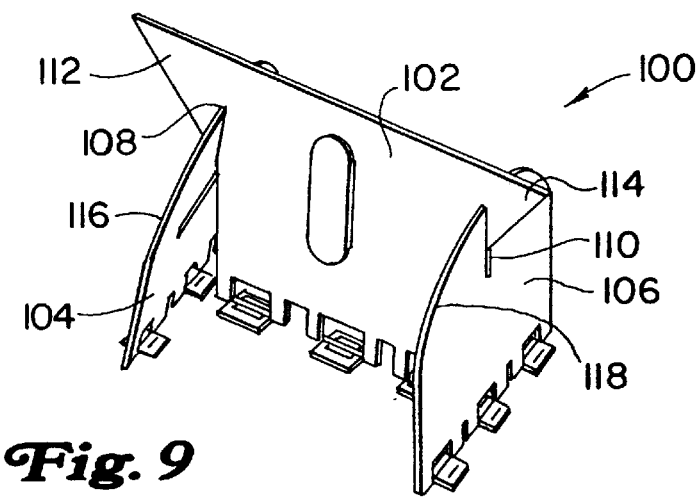
FIG. 9 is yet another MEMS made in accordance with the present invention.

FIG. 9 shows a MEMS 100 having a primary flap 102, flanked by secondary flaps 104, 106. The sequence of actuation of this device is not critical to assembly. The device will assemble if all three flaps rise to 90°, regardless of the order of actuation. If the primary flap 102 rises to 90° first, then the secondary flaps 104, 106 rise 90° to lock the primary flap 102 into place. On the other hand, secondary flaps 104, 106 may rise to 90° first. As the primary flap 102 then rises to 90°, it pushes the secondary flaps outward slightly and then locks into place when it reaches slots 108, 110. This is accomplished by providing angular sides 112, 114 on the primary flap 102, and rounded edges 116, 118 on the secondary flaps 104, 106.

The many advantages of this invention are now apparent. An array of devices can be actuated in parallel with a single uniform magnetic field. The three-dimensional hinged micro structures are actuated with a linear sweep of $H_{ext}$. Three-dimensional MEMS devices having more than one flap are asynchronously actuated by a single magnetic source, and an actuator on a chip is not required for assembly. The devices can be provided with multiple flaps which interlock when assembled, and do not require a constant energy source to remain assembled.

While the principles of the invention have been described above in connection with specific apparatus and applications, it is to be understood that this description is made only by way of example and not as a limitation on the scope of the invention.

What is claimed is:

1. A microelectromechanical system comprising:

at least first and second flaps secured to a substrate, said substrate defining a plane, said first and said second flaps being hinged to be rotatable away from the plane of said substrate, first magnetic material on said first flap in a volume such that said first flap rotates when subjected to an external magnetic field $H_{f1}$, and second magnetic material on said second flap in a volume such that said second flap rotates when subjected to an external magnetic field $H_{f2}$;

said $H_{f2}$ being greater than said $H_{f1}$, so that said first flap rotates before said second flap in an external magnetic field which increases from $H_{f1}$ to $H_{f2}$.

2. The system of claim 1 wherein said first and said second flaps interact with each other when rotated, and become interlocked.

3. The system of claim 2 wherein said second flap includes an indentation into which said first flap fits, to interlock said first and said second flaps.

4. A three dimensional microelectromechanical system having at least two flaps, said flaps being hinged at an angle to each other, said flaps being responsive to a magnetic field such that when placed in an increasing magnetic field, said flaps are raised asynchronously at different times, said flaps interacting with each other when raised and becoming interlocked in a three dimensional array.

5. The system of claim 4 wherein one of said flaps has an indentation into which another of said flaps fits, in order to interlock said flaps.

6. The system of claim 4 comprising a spring lever on a selected one of said flaps, said spring member providing resistance to rotation of said selected flap, so that when raising said flaps, said selected flap requires a stronger magnetic field than said other flaps.

7. The system of claim 4 comprising three of said flaps, including a primary flap and two secondary flaps, said primary flap rising before said secondary flaps when an increasing magnetic field is applied to said system.

8. The system of claim 4 comprising three of said flaps, including a primary flap and two secondary flaps, said primary flap having angular sides, and said secondary flaps having rounded edges.

9. A method for using a three dimensional microelectromechanical system having at least two flaps, said flaps being hinged at an angle to each other, said flaps being responsive to a magnetic field such that when placed in an increasing magnetic field, said flaps are raised asynchronously at different times, comprising the steps of placing the system in a magnetic field having a strength which is insufficient to raise the flaps, increasing the magnetic field strength until it is sufficient to raise one of said flaps, and further increasing the magnetic field strength until it is sufficient to raise another of said flaps.

* * * * *

UNITED STATES PATENT AND TRADEMARK OFFICE
CERTIFICATE OF CORRECTION

PATENT NO. : 6,166,478
DATED : December 26, 2000
INVENTOR(S) : Yi et al.

Page 1 of 1

It is certified that error appears in the above-identified patent and that said Letters Patent is hereby corrected as shown below:

Column 2,
Line 64, delete "$H_{t1}$ 1" and insert -- $H_{t1}$ -- therefor.

Signed and Sealed this

Eighteenth Day of December, 2001

Attest:

Attesting Officer

JAMES E. ROGAN
*Director of the United States Patent and Trademark Office*